United States Patent
Sou et al.

(10) Patent No.: US 8,592,935 B2
(45) Date of Patent: Nov. 26, 2013

(54) MGS SOLAR-BLIND UV RADIATION DETECTOR

(75) Inventors: Iam Keong Sou, Kowloon (HK); Ying Hoi Lai, Kowloon (HK); Shu Kin Lok, Tuen Mun (HK); Wai Yip Cheung, Kowloon (HK); George Ke Lun Wong, Sai Kung (HK); Kam Weng Tam, Flower (CN); Sut Kam Ho, Flower (CN)

(73) Assignees: The Hong Kong University of Science and Technology, Hong Kong (CN); University of Macau, Macau (CN)

( * ) Notice: Subject to any disclaimer, the term of this patent is extended or adjusted under 35 U.S.C. 154(b) by 0 days.

(21) Appl. No.: 13/488,559

(22) Filed: Jun. 5, 2012

(65) Prior Publication Data

US 2012/0306042 A1 Dec. 6, 2012

Related U.S. Application Data

(60) Provisional application No. 61/457,795, filed on Jun. 6, 2011, provisional application No. 61/457,896, filed on Jun. 30, 2011.

(51) Int. Cl.
*H01L 21/70* (2006.01)
(52) U.S. Cl.
USPC ............................................. 257/449
(58) Field of Classification Search
USPC .......... 257/449, 453, 184, 472, 473, E31.016, 257/E31.065, E21.605, E27.012, E29.104, 257/E29.259; 438/268, 522, 542, 433
See application file for complete search history.

(56) References Cited

U.S. PATENT DOCUMENTS

| | | | |
|---|---|---|---|
| 5,427,977 A * | 6/1995 | Yamada et al. | 438/22 |
| 6,610,985 B2 | 8/2003 | Sou et al. | |
| 6,724,018 B2 | 4/2004 | Ando et al. | |
| 7,432,577 B1 | 10/2008 | Weiss et al. | |
| 2003/0020021 A1 * | 1/2003 | Sou et al. | 250/372 |
| 2005/0046622 A1 * | 3/2005 | Nakanishi et al. | 345/173 |

OTHER PUBLICATIONS

Ozbay, Ekmel, Tut, Turgot, and Biyikli, Necmi; "High-performance solar-blind AlGaN photodetectors," Quantum Sensing and Nanophotonic Devices II, , Proceedings of SPIE vol. 5732 (SPIE, Bellingham, WA, 2005).*
"MNT Gas Sensor Roadmap", prepared by the MNT Gas Sensor Forum, 87 pages, (Dec. 2006).
Sou, I. K. et al., "Molecular-beam-epitaxy-grown ZnMgS ultraviolet photodetectors", Applied Physical Letter, vol. 78, No. 13, pp. 1811-1813, (Mar. 26, 2001).
Ozbay, E. et al., "High-performance solar-blind AlGaN photodectors", Proceedings of SPIE, vol. 5732, pp. 375-388, (2005).
Gorokhov, E. V. et al. "Solar-Blind UV Flame Detector Based on Natural Diamond", Instruments and Experimental Techniques, vol. 51, No. 2, pp. 280-283, (2008).

(Continued)

*Primary Examiner* — Yu-Hsi D Sun
*Assistant Examiner* — Christina Sylvia
(74) *Attorney, Agent, or Firm* — Nath, Goldberg & Meyer; Jerald L. Meyer; Stanley N. Protigal

(57) ABSTRACT

A UV detector is designed to provide a photoresponse with a cutoff wavelength below a predetermined wavelength. The detector uses a sensor element having an active layer comprising a MgS component grown directly on a substrate. A thin layer metal layer is deposited over the active layer and forms a transparent Schottky metal layer.

20 Claims, 5 Drawing Sheets

(56) References Cited

OTHER PUBLICATIONS

Suzuki, R., et al. "Enhancement of responsivity in solar-blind-Ga 203 photodiodes with a Au Schottky contact fabricated on single crystal substrates by annealing", Applied Physics Letters, vol. 94, (009), 4 pages, (2009).

Xing, J., et al., "Solar-blind deep-ultraviolet photodetectors based on an LaAlOz single crystal", Optics Letters, vol. 34, No. 11, pp. 1675-1677, (2009).

Du, X. et al.,"Controlled Growth of High-Quality ZnO=Based Films and Fabrication of Visible-Blind and Soar-Blind Ultra-Violet Detectors", Advanced Materials, vol. 21, pp. 4625-4630, (2009).

Ju, Z. G., et al., "MgzAn1-zO-based photodetectors covering the whole solar-blind spectrum range", Applied Physics Letters, vol. 93, pp. 173505-1-173505-3, (2008).

Wang, L. K., et al., "MgZnO metal-semiconductor-metal structured solar-blind photodetector with fast response", Solid State Communications, vol. 149, pp. 2012-2023, (2009).

Wang, L. K., et al. "Single-crystalline cubic MgZnO films and their application in deep-ultravilet optoelectronic devices", Appied Physics Letters, vol. 95, 4 pages, (2009).

Takagi, T., et al., "Molecular Beam Epitaxy of High Magnesium Content Single-Phase Wurzite MgrZn1-xO Alloys ($x \approx 0.5$) and Their Application to Solar-Blind Region Photdetectors", Jpn J. Appl. Phys., vol. 42, pp. L 401-L403, (2003).

Bradford, C., et al., "Growth of zinc blended MgS/ZnSe single quantum wells by molecular-beam epitaxy using ZnS as a sulphur source", Applied Physics Letters, vol. 76, No. 26, pp. 3929-3931, (Jun. 26, 2000).

Korecki, P., et al., Holographic inversion of Kikuchi electron diffraction patterns of thin epitaxial NaCl films grown on GaAs (001), Surface Science vol. 425, pp. 22-30, (1999).

Szymonski, M. et al., "Structure and electronic properties of ionic nano-layers MBE-grown on III-V semiconductors", Thin Solid Films vol. 367, pp. 134-141, (2000).

Klauser, R., et al., "Electronic properties of ionic insulators on semiconductors surfaces: Alkali fluorides on GaAs (100)", Physical Review B, vol. 40, No. 5, (Aug. 15, 1989).

Nashimoto, K., et al., "Epitaxial growth of MgO on GaAs(001) for growing epitaxial BaTiO3 thin films by pulsed laser deposition", App. Phys, Lett. vol. 60 No. 10, pp. 1199-1201, (Mar. 9, 2012).

Britney's Lip-Glossary of Semiconductor Physics, Optoelectronics and Photonics (from Britney Spears' Guide to Semiconductor Physics) http://britneyspears.ac/physics/lipgloss/gloss.htm downloaded May 12, 2012.

\* cited by examiner

MGS SOLAR-BLIND UV RADIATION DETECTOR

RELATED APPLICATION(S)

The present Patent Application claims priority to U.S. Provisional Patent Application No. 61/457,795 filed Jun. 6, 2011, and U.S. Provisional Patent Application No. 61/457,896 filed Jun. 30, 2011, which are assigned to the assignee hereof and filed by the inventors hereof and which are incorporated by reference herein.

BACKGROUND

1. Field

The present disclosure relates to optical sensors, including solar blind sensors and sensors useful for fire detection.

2. Background

Property management, whether for government buildings, institutions, business buildings and residence, is implemented for protecting and preserving the buildings, stored properties and occupants. A multisensor system is usually employed by property managers to minimize adverse impact due to climate, pollution, theft, vandalism, insects, mold and fire. Fire, because of the speed and totality of its destructive forces, constitutes one of the more serious threats, and thus fire detection is one of the most important issues in today's building design.

The most commonly used fire detector in fire safety sector is the smoke detector. Conventional smoke detectors often have a high false alarm rate, with some estimates of ratios of false to actual alarms in excess of 10 to 1. Smoke detectors also suffer from their slow response for a large monitoring area due to the fact that the detector will not be activated until the smoke generated from the fire source reaches the detector. Smoke detectors are unsuitable as a fire detection device in car parks, since the products of combustion produced by exhaust fumes from a vehicle will cause a smoke detector to activate and produce a false alarm.

In another type of fire detector, a quartz tube filled with an inert gas conducts electricity when a photon of wavelength between 185 and 260 nm of a flame temporarily makes the gas conductive. The tube amplifies this conduction by a cascade effect and outputs a current pulse. Disadvantages of this technology include that the detection system is 1) bulky; 2) expensive (a pulse counter is needed for signal readout); 3) hard to maintain (high-voltage operation usually causes a lifetime in the order of only 10,000 hours); and 4) prone to crosstalk interference because the discharge tube itself emits ultraviolet radiation in operation. It is also difficult to use and does not allow the use of two or more flame detectors of this kind at the same time in close proximity since they may optically interfere with each other.

SUMMARY

A sensor element for UV detector is formed, which provides a photoresponse with a cutoff wavelength below a predetermined wavelength, useful as a solar-blind detector. A semiconductor substrate has an active layer grown directly on it, the active layer, said active layer grown directly on said substrate. The active layer includes a MgS component. A thin layer metal layer is deposited over the active layer and forms a transparent Schottky metal layer.

DETAILED DESCRIPTION

Overview

Figure 1:
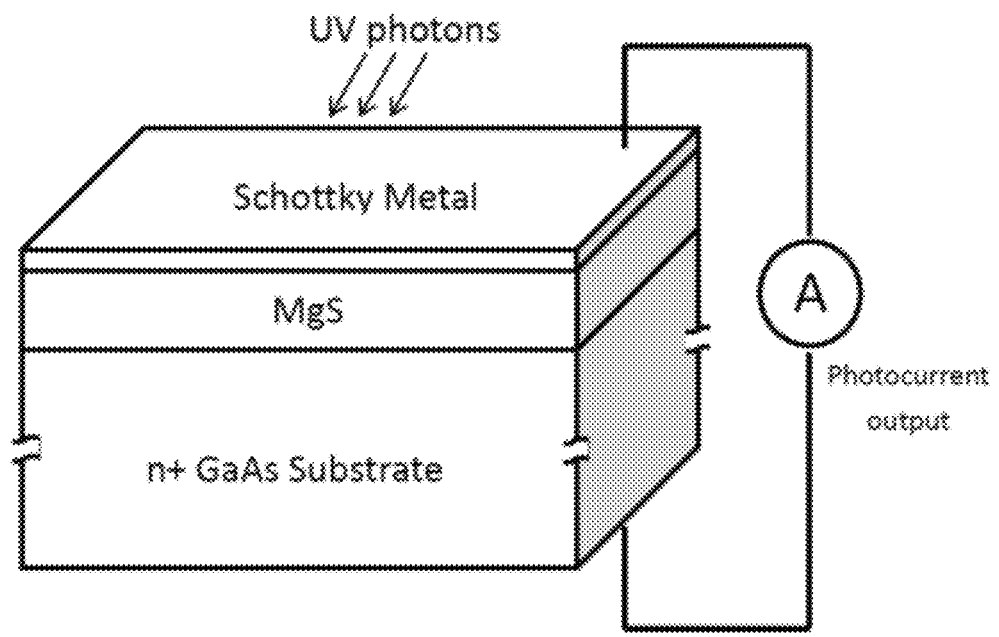
FIG. 1 is a schematic diagram showing the circuit of an MgS solar-blind UV Radiation detector.

Flame detectors have advantages as compared to smoke detectors, and have recently attracted much research and development attention. Flame detectors use optical sensors working at specific spectral ranges, usually within a narrow band, to record the incoming radiation at the selected wavelengths. The signals are then analyzed using a predetermined technique. The technique may include flicker frequency, threshold energy signal comparison, mathematical correlation between several signals, correlation to memorized spectral analysis, or any other technique.

Flame detectors are available in a number of sensor types, the most common including UV detectors or UV/IR detectors. UV-only flame detectors, or ultraviolet spectral band detection, work with wavelengths shorter than 300 nm, sometimes referred to as the solar blind spectral band. The UV-only detectors detect flames at high speed (3-4 milliseconds) due to the UV high-energy radiation emitted by fires and explosions at the instant of their ignition. UV/IR detectors compare the threshold signal in two spectral ranges and the ratio of the signals in the two spectral ranges to each other to confirm the reliability of the fire signal, minimizing false alarms. Since the technology of IR radiation detection has been well established and mature, short-wavelength UV or solar blind detection is the core technology needed to be further developed for flame detectors.

The technology for UV flame detection currently adopted in the market is based on the photoelectric effect of metal and the gas multiplication effect, similar to that of a Geiger-Müller counter.

Recent effort has been devoted in the research of solar-blind UV thin film detectors based on wide-bandgap semiconductors such as MgZnS, AlGaN, diamond, $Ga_2O_3$, $LaAlO_3$ and ZnMgO. Among these materials, those based on ternary alloys are difficult to achieve the desired composition in mass production. Diamond detectors are difficult to make and costly to fabricate. $Ga_2O_3$-based detectors reported so far seem to require application of a voltage bias for operation and a post-growth thermal annealing for improving their photoresponse characteristics. $Ga_2O_3$-based detectors also require the use of an oxygen source in their production, which could increase deterioration of fabrication facilities due to unintentional oxidation.

The present disclosure is based on the use of a binary compound material, MgS, as the active layer of the detector. By the use of a binary compound material MgS, the photoresponse spectra of the produced detectors can remain almost identical even for a large-scale production, without being affected by the consumption of the stored sources in the growth system. The described MgS solar-blind detector can be operated in zero-bias mode without the need of an external power supply. Additionally, MgS is an environment friendly material. The response cutoff of the disclosed detector is at approximately 250 nm, which can be considered an ideal value for solar-blind flame detection.

A solar-blind UV detector provides a peak photoresponse at wavelengths below 250 nm together with a rejection higher than two orders at 300 nm and higher than five orders at 500 nm. The working principle of the disclosed detector is based on the photovoltaic effect of a Schottky-barrier diode with a MgS thin film as the active layer.

MgS exists in different phases, including a rocksalt phase, a wurtzite phase and a zincblende phase, with the rocksalt phase being a more stable phase. Previous studies show that the less stable phase, zincblende, is usually formed on a smooth ZnSe buffer layer grown on a GaAs (100) substrate. The disclosure provides an approach to grow rocksalt MgS thin film directly on a GaAs (100) substrate, in which, the difference in the preference of bonding between GaAs and ZnSe with MgS together with the strong ionic nature of MgS are believed to be the driving force leading to the formation of the rocksalt phase of MgS directly on a GaAs (100) substrate. It was also found that a lower growth rate could significantly reduce the strong reaction between the resulting MgS thin film and the water vapor in air, allowing the potential applications of MgS-based optoelectronic devices to become practical and feasible. While the rocksalt phase of MgS was described, it was also found that wurtzite MgS can be directly grown on a GaAs (111)B substrate and its corresponding Schottky-barrier diode also acts as an effective solar-blind UV detector. The wurtzite structure is based on the hexagonal close packed lattice (hcp).

Thin Film Growth

Zincblende MgS thin film growth has been reported by Bradford, et al., in "Growth of Zinc Blende MgS/ZnSe Single Quantum Wells by Molecular-Beam Epitaxy Using ZnS as a Sulphur Source", Appl. Phys. Lett., 76, 3929 (2000). Bradford, et al. report that the growth of zincblende MgS thin film on a smooth ZnSe (100) buffer grown on a GaAs (100) substrate can be achieved using the molecular beam epitaxy. Since the zincblende phase of MgS is metastable, a deteriorated transition from zincblende to rocksalt phase after the growth reaches a critical thickness was observed. Zincblende has a structure of tetrahedral crystals, also known as sphalerite, including two interpenetrating face-centred cubic lattices (fcc) with one of the lattices displaced in each direction by ¼ of a lattice parameter.

One of the simplest device structures of a MgS-based solar-blind UV structure is a Schottky-barrier type in which an n+-GaAs (100) substrate is used as the bottom electrode. The inclusion of a ZnSe buffer between the GaAs substrate and the MgS active layer has the disadvantage of providing a strong visible response since the bandgap of ZnSe is around 2.7 eV with a corresponding spectral cutoff at 460 nm. On the other hand, the rocksalt phase is in fact a stable structure of MgS. It has been found that rocksalt MgS can be directly formed on an n+-GaAs (100) substrate. The cutoff wavelength of a MgS detector is directly related to the energy bandgap of the MgS active layer.

The rocksalt MgS growth is carried out using an elemental Mg effusion cell and a compound ZnS effusion cell. By tuning the source fluxes, substrate temperature, the composition of the as-grown thin films were confirmed to be substantially pure MgS without detectable trace of Zn using the in-situ Auger electron spectroscopy. Post-growth electron back scattering diffraction studies confirm the resulting MgS thin films are in rocksalt phase. Through in-situ high energy electron diffraction studies on the spacing of the observed streaks and ex-situ high resolution x-ray diffraction characterization, the rocksalt phase of these films were further confirmed.

Several research groups have reported that rocksalt NaCl, RbF and MgO can directly form on zincblende or diamond substrates.

The following may explain why rocksalt MgS may be preferred to form directly on a GaAs (100) substrate while zincblende MgS is a preferred phase if the growth is carried out on a ZnSe (100) surface. First, GaAs is a III-V material while ZnSe is a II-VI material, so each should show different bonding nature with a MgS lattice. Along the <100> direction, for a compound zincblende structure, each lattice plane is occupied by one type of atoms while for a compound rocksalt structure, each lattice plane is shared by two types of atoms. Since both zincblende MgSe and ZnS phases naturally exist, the formation of zincblende MgS on a ZnSe surface is indeed possible. On the other hand, MgAs has not been shown to exist so far in nature while GaS only exists in hexagonal structure, making the formation of zincblende MgS on a GaAs substrate become unfavorable. For the latter case, the formation of rocksalt MgS directly on a GaAs substrate becomes feasible since MgS has a strong ionic nature and it could be grown in rocksalt structure along its preferred <100> direction on top of a non-rocksalt substrate similar to the growth of rocksalt MgO on GaAs(100) substrate as reported elsewhere (K. Nashimoto, D. K. Fork and T. H. Geballe, "Epitaxial growth of MgO on GaAs(001) for growing epitaxial $BaTiO_3$ thin films by pulsed laser deposition", Appl. Phys. Lett. 60, 1199 (1992)).

Studies on the growth rate dependence on the stability of the as-grown rocksalt MgS thin films show that the use of relatively lower MgS growth rate (around 0.3 Å/s) could significantly reduce the reaction of the as-grown MgS thin films with the water vapor in air as compared with those samples grown using relatively higher MgS growth rates. The as-grown MgS samples were then removed from the MBE growth system followed by a deposition of a thin Au Schottky metal layer on top of the active MgS layer using the RF sputtering technique. The fabricated Schottky-barrier photodiode wafers were then cut into small pieces for carrying out the characterization of their spectral photoresponse. The photoresponse yield of these devices offers a peak photoresponse at wavelength around 240 nm together with a rejection higher than two orders at 300 nm and higher than five orders at 500 nm. The external quantum efficiency at the peak response was around 10%.

By applying similar growth conditions as used in the growth of rocksalt MgS thin films on GaAs (100) substrate, a MgS thin film was deposited on a GaAs (111)B substrate. From a detailed in-situ RHEED studies, the as-grown MgS thin film on this substrate was found to be in wurtzite phase. It is believed that the 6-fold symmetry of the (111)B surface may be the cause of the formation of the wurtzite phase rather than the rocksalt phase of MgS on this substrate. Schottky-barrier diodes fabricated on a wurtzite MgS/n+-GaAs (111)B structure have been fabricated and they show similar performance in their photoresponse and external quantum efficiency as those of the Schottky-barrier diodes fabricated on a rocksalt MgS/n+-GaAs (100) structure.

Structure

FIG. 1 is a schematic diagram showing the circuit of an MgS solar-blind UV Radiation detector. A substrate 115, given in this example as an n+ GaAs (100) substrate, has MgS active layer 121 coated on it by growing the active layer directly on substrate 115 by molecular beam epitaxy. A Schottky metal 123 is coated on active layer 121, by molecular beam epitaxy, sputtering or ebeam evaporation technique.

In this structure, MgS layer 121 forms the active layer of the Schottky barrier. The active layer can be fabricated by growth on the substrate with a growth rate lower than or equal to 0.3 Å per second.

Schottky metal 123 is sufficiently thin to pass light in the preferred bandwidth, as a transparent Schottky metal. In one configuration, the Schottky metal layer comprises Au thin film with thickness of around 10 nm fabricated by either sputtering or ebeam evaporation technique. The thickness can range from about 5 nm to about 40 nm. Alternatively, the Schottky metal can include at least one of Cr, Al, Au, or other materials suitable for metallization of semiconductor circuits. Further examples include Ag, Mg and Pd. As another alternative, thin metal layer can be deposited as a transparent Schottky metal by chemical vapor deposition (CVD) or another physical process.

Substrate 115 forms the bottom electrode. Substrate 115 can be made of any compatible material, and can be a semiconductor substrate or semiconductor on glass or any compatible substrate. In the example, substrate 115 comprises at least a layer of n+-GaAs comprising a majority component of n+ GaAs (100) substrate material, in combination with n+ GaAs having (111)B and (110) orientations.

Figure 2:
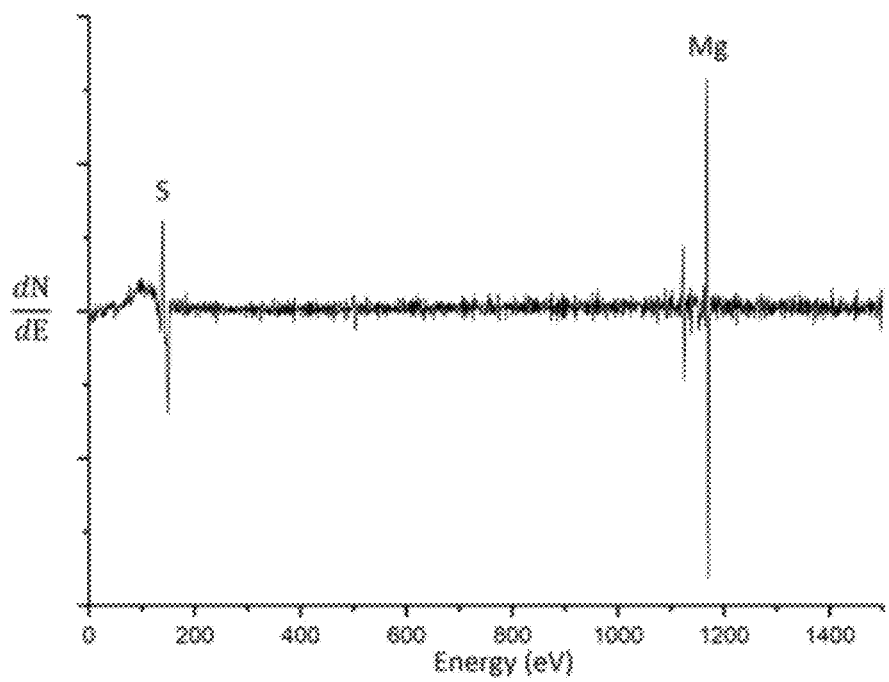
FIG. 2 is a graph depicting the Auger electron spectroscopy spectrum of an as-grown MgS thin film.

FIG. 2 is a graph depicting the Auger electron spectroscopy spectrum of an as-grown MgS thin film.

Figure 3:
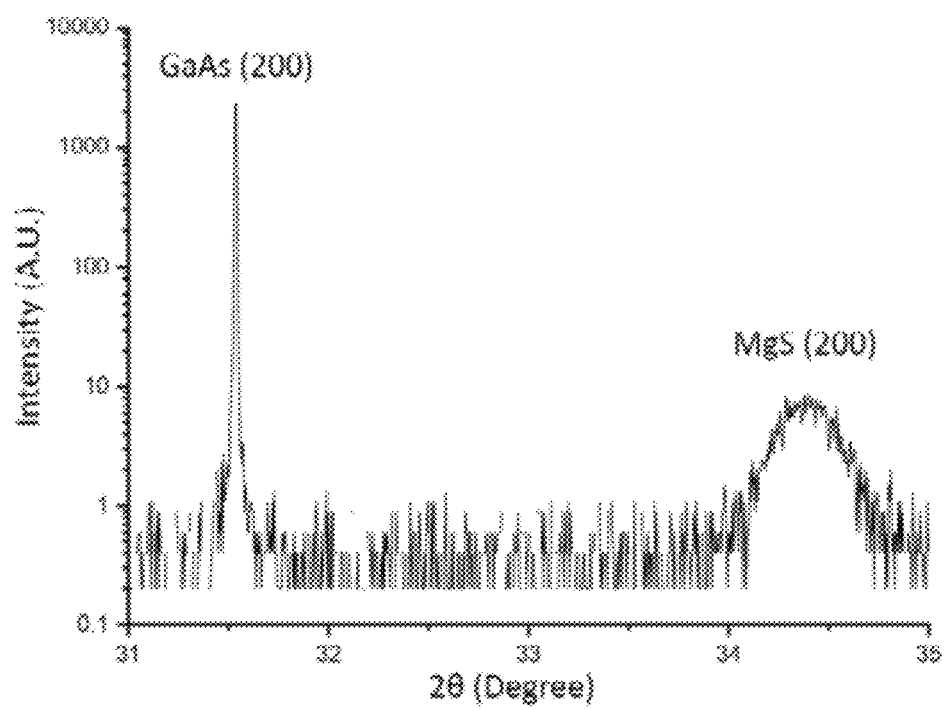
FIG. 3 is a graph depicting the high-resolution X-ray diffraction spectrum of a rocksalt-MgS thin film.

FIG. 3 is a graph depicting the high-resolution X-ray diffraction spectrum of a rocksalt-MgS thin film.

Figure 4:
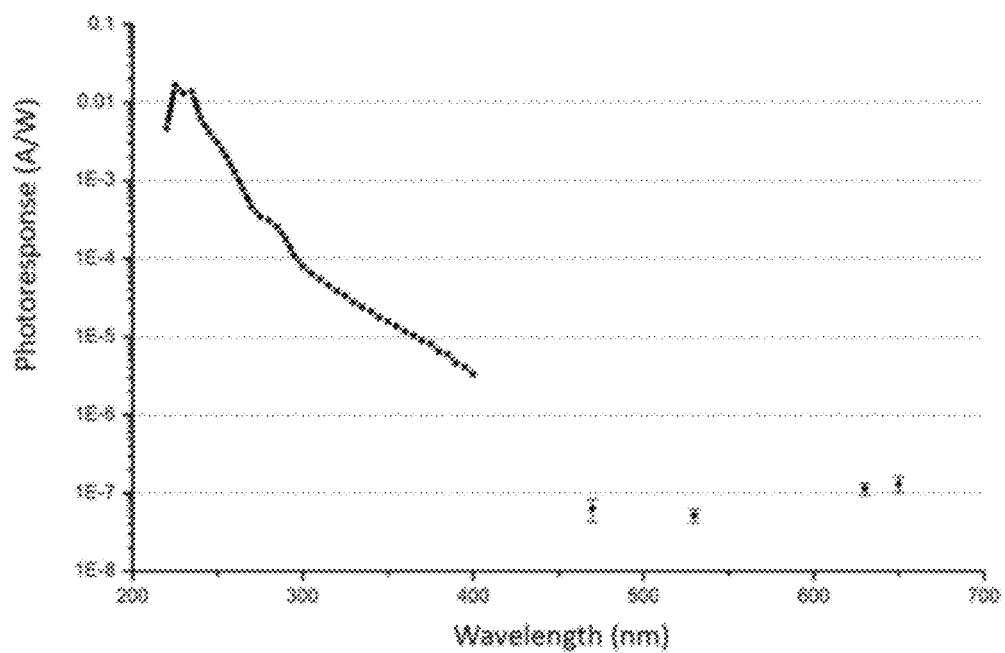
FIG. 4 is a graph depicting photoresponse vs wavelength for a rocksalt-MgS detector.

FIG. 4 is a graph depicting photoresponse vs wavelength for a rocksalt-MgS detector. As can be seen, the photoresponse is such that the sensor is more responsive at wavelength of 240 nm and below, which provides a good solar blind response.

Figure 5:
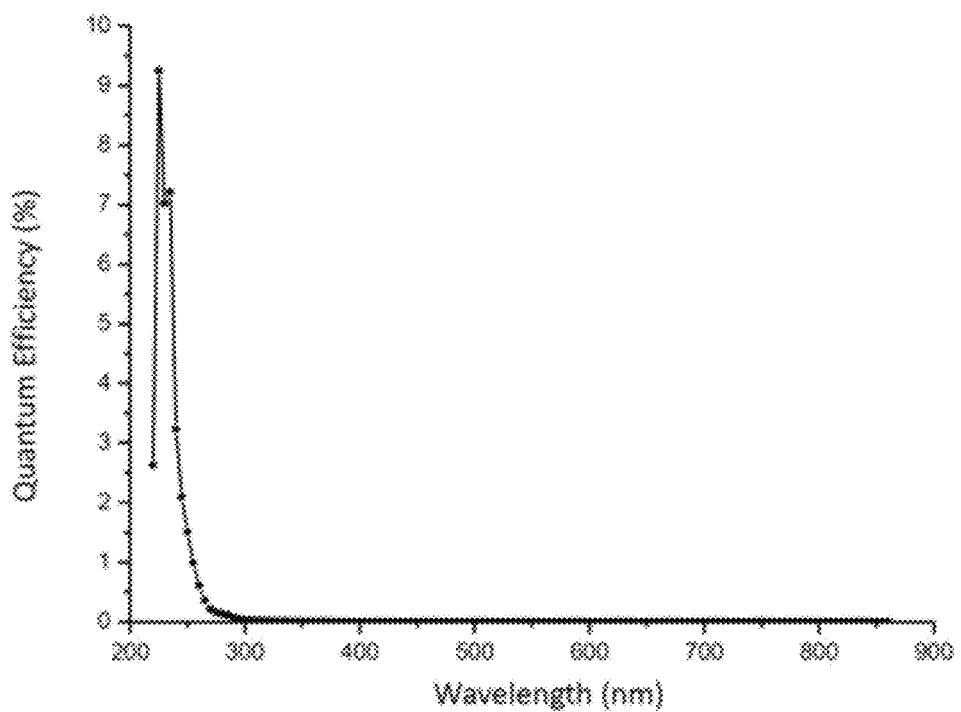
FIG. 5 is a graph depicting quantum efficiency vs wavelength for a rocksalt-MgS detector.

FIG. 5 is a graph depicting quantum efficiency vs wavelength for a rocksalt-MgS detector. The external quantum efficiency η is calculated according to the standard expression given as:

$$\eta = \frac{I_{sc}hc}{Pe\lambda}$$

where h is the Plank's constant, c is the speed of light, e is the electron charge, λ is the wave length of the incident photons, P is the incident photon power and $I_{sc}$ is the short circuit current yielded upon illumination.

Figure 6:
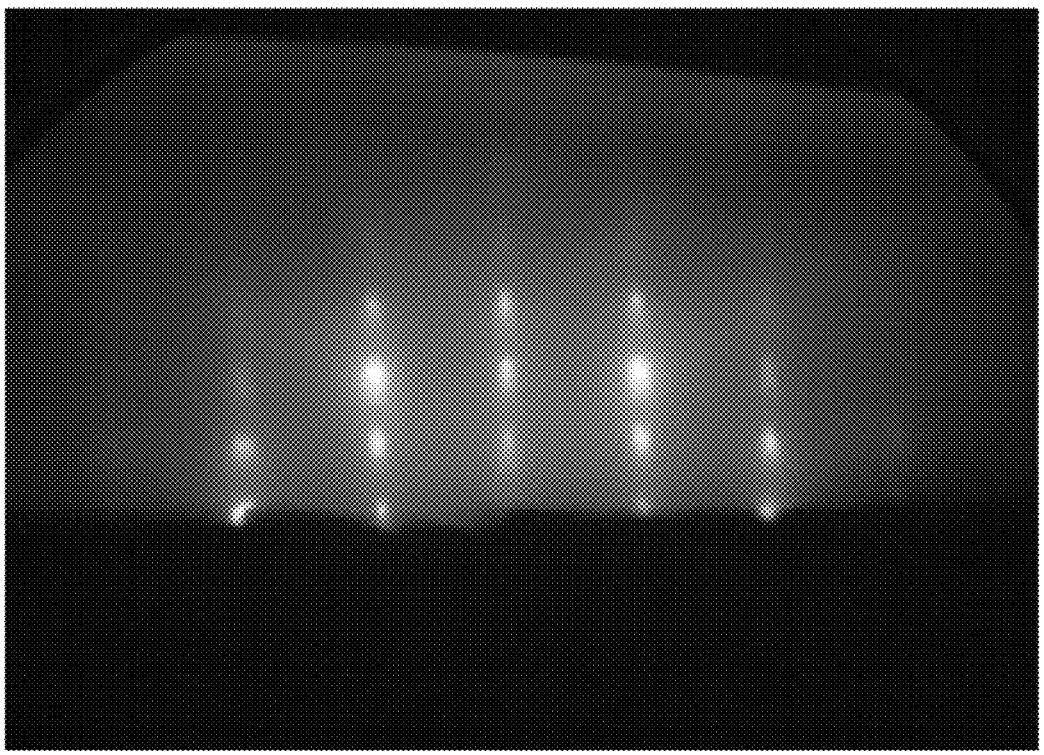
FIGS. 6 and 7 are reflection high-energy electron diffraction patterns obtained from a wurtzite MgS thin film.
Figure 7:
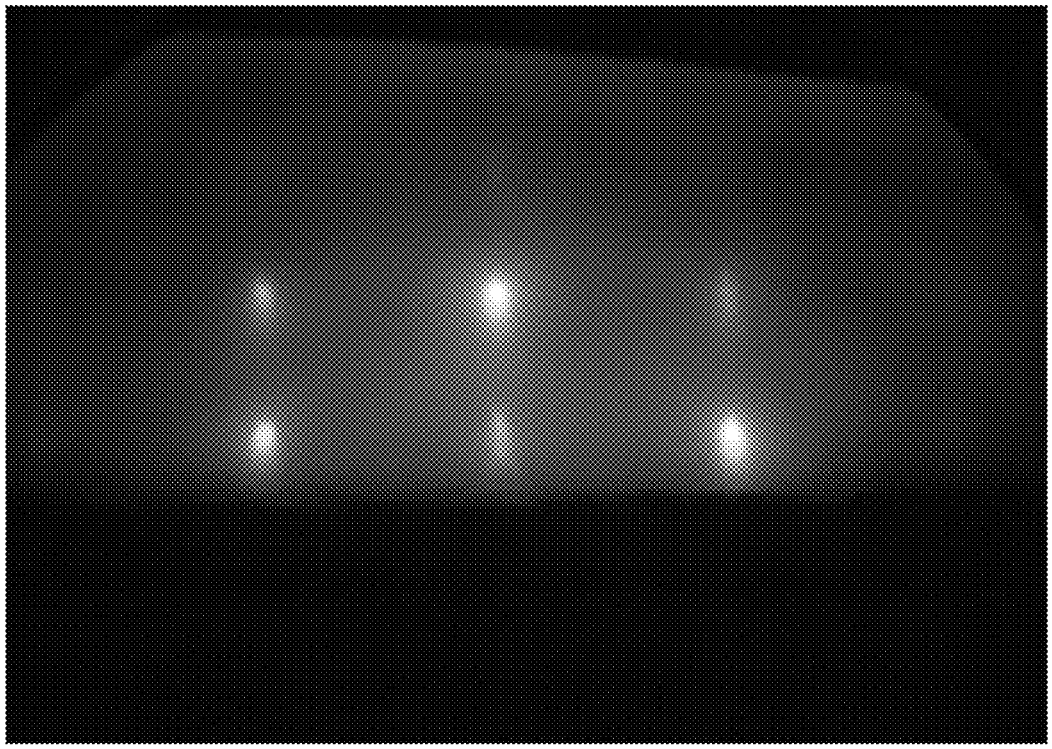
Figure 8:
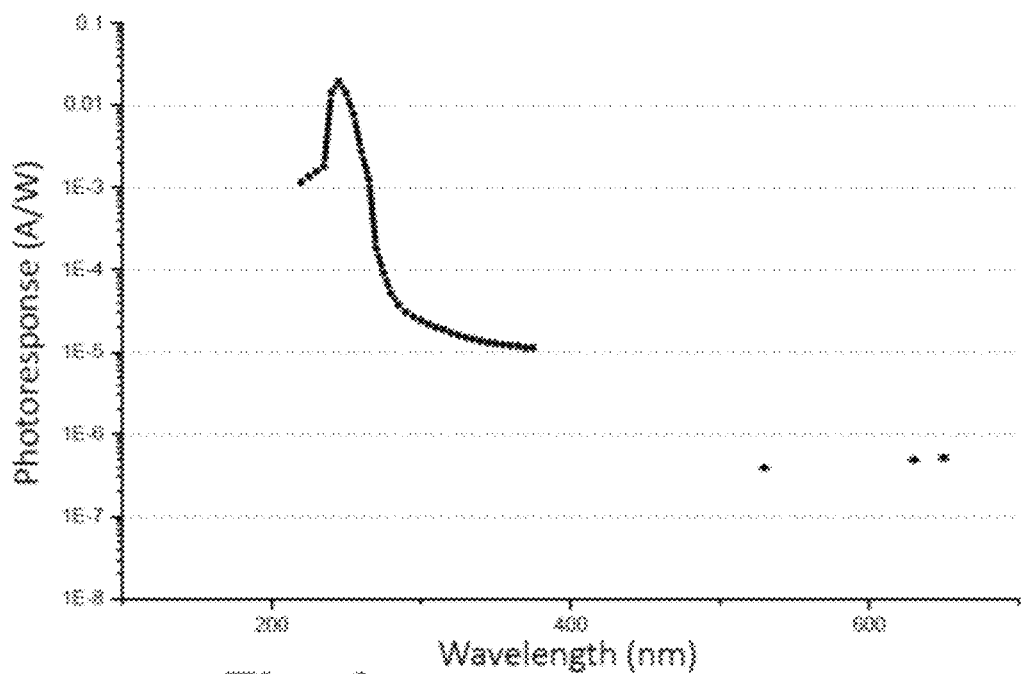
FIG. 8 is a graph depicting photoresponse vs wavelength for a wurtzite MgS detector.

It was found that different results in the crystalline structure of a MgS thin film could be obtained according to the GaAs substrate on which the MgS thin film is grown. A MgS thin film could be grown in rocksalt phase when a GaAs (100) substrate is used, while it could be grown in wurtzite phase when a GaAs (111)B substrate is used. FIGS. 2-5 depict the properties of MgS thin film in rocksalt phase, whereas FIGS. 6-8 depict the properties of MgS thin film in wurtzite phase. FIGS. 6 and 7 are reflection high-energy electron diffraction patterns obtained from a wurtzite MgS thin film.

FIG. 8 is a graph depicting photoresponse vs. wavelength for a wurtzite MgS detector.

Figure 9:
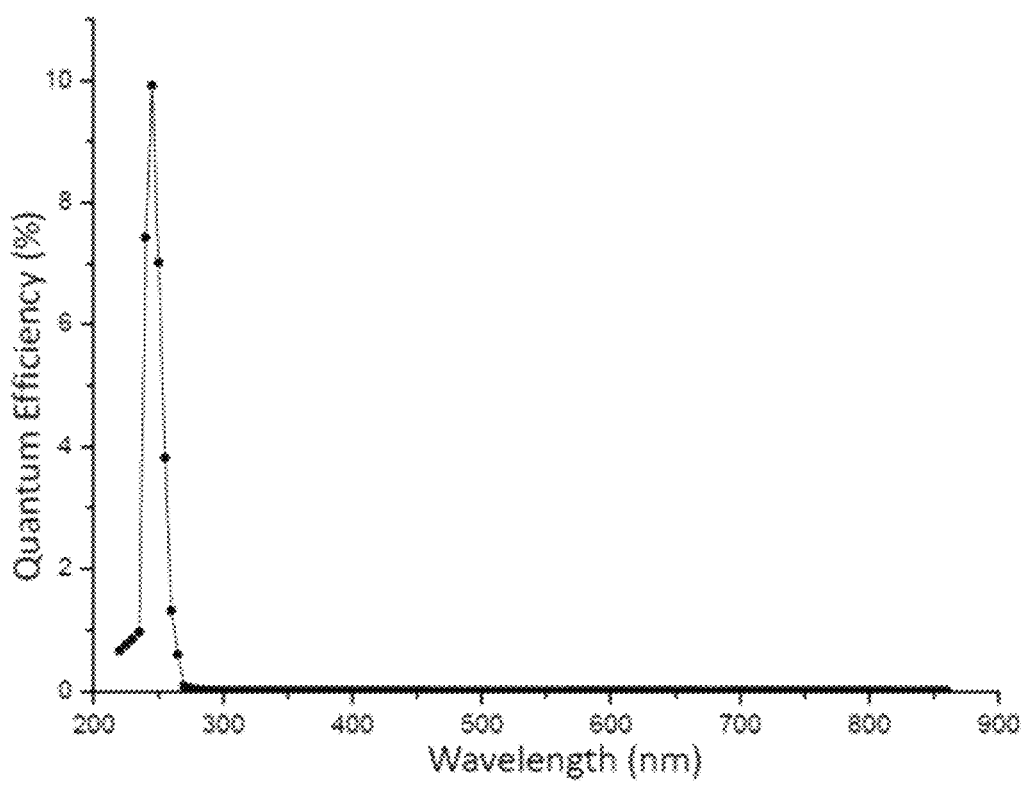
FIG. 9 is a graph depicting quantum efficiency vs wavelength for a wurtzite MgS detector.

FIG. 9 is a graph depicting quantum efficiency vs. wavelength for wurtzite MgS detector.

Conclusion

It will be understood that many additional changes in the details, materials, steps and arrangement of parts, which have been herein described and illustrated to explain the nature of the subject matter, may be made by those skilled in the art within the principle and scope of the invention as expressed in the appended claims.

What is claimed is:

1. A sensor element for UV detector which provides a photoresponse with a cutoff wavelength below a predetermined wavelength, comprising:
   a semiconductor substrate;
   an active layer comprising a MgS thin film component selected from the group consisting of rocksalt MgS thin film and wurtzite MgS thin film, said active layer grown directly on said substrate; and
   a thin metal layer deposited over the active layer and forming a transparent Schottky metal layer and having a photoresponse with a cutoff wavelength below the predetermined wavelength.

2. The UV detector of claim 1, having a photoresponse with a cutoff wavelength below 250 nm.

3. The UV detector of claim 1, wherein said active layer comprises a rocksalt MgS thin film.

4. The UV detector of claim 1, wherein said active layer comprises a wurtzite MgS thin film.

5. The UV detector of claim 1, wherein said Schottky metal layer comprises Au thin film with thickness between 5 nm and 40 nm fabricated by either sputtering or ebeam evaporation technique.

6. The UV detector of claim 1, wherein said Schottky metal layer comprises Au thin film with thickness around 10 nm fabricated by either sputtering or ebeam evaporation technique.

7. A sensor element for UV detector which provides a photoresponse with a cutoff wavelength below a predetermined wavelength, comprising:
   a semiconductor substrate,
   an active layer comprising a MgS component, said active layer grown directly on said substrate; and
   a thin metal layer deposited over the active layer and forming a transparent Schottky metal layer and having a photoresponse with a cutoff wavelength below the predetermined wavelength,
   wherein said substrate comprises at least a layer of n+-GaAs.

8. The UV detector of claim 7, wherein said substrate comprises at least a layer of n+-GaAs comprising n+ GaAs (100).

9. The UV detector of claim 7, wherein said substrate comprises at least a layer of n+-GaAs comprising a majority component of n+ GaAs (100) substrate material, in combination with n+ GaAs having (111)B and (110) orientations.

10. The UV detector of claim 7, having a photoresponse with a cutoff wavelength below 250 nm.

11. The UV detector of claim 7, wherein said Schottky metal layer comprises Au thin film with thickness between 5 nm and 40 nm fabricated by either sputtering or ebeam evaporation technique.

12. The UV detector of claim 7, wherein said Schottky metal layer comprises Au thin film with thickness around 10 nm fabricated by either sputtering or ebeam evaporation technique.

13. A sensor element for UV detector which provides a photoresponse with a cutoff wavelength below a predetermined wavelength, comprising:
   a semiconductor substrate;
   an active layer comprising a MgS component, said active layer grown directly on said substrate; and a thin metal layer deposited over the active layer and forming a transparent Schottky metal layer and having a photoresponse with a cutoff wavelength below the predetermined wavelength, wherein the detector has a configuration of a Schottky-barrier type detector element in which an n+-GaAs (100) substrate forms a bottom electrode.

14. The UV detector of claim 13, having a photoresponse with a cutoff wavelength below 250 nm.

15. The UV detector of claim 13, wherein said Schottky metal layer comprises Au thin film with thickness between 5 nm and 40 nm fabricated by either sputtering or ebeam evaporation technique.

16. The UV detector of claim 13, wherein said Schottky metal layer comprises Au thin film with thickness around 10 nm fabricated by either sputtering or ebeam evaporation technique.

17. A method for forming a sensor element for a UV detector which provides a photoresponse with a cutoff wavelength below a predetermined wavelength, the method comprising:

providing a semiconductor substrate;

forming an active layer on the substrate by growth directly on the substrate using molecular beam epitaxy, comprising a MgS component; and forming a transparent Schottky metal layer by depositing a thin metal layer over the active layer, by selecting the thickness of the transparent Schottky metal layer to have a photoresponse with a cutoff wavelength below the predetermined wavelength, wherein the depositing a thin metal layer as a transparent Schottky metal comprises the use of the molecular beam epitaxy.

18. The method of making a UV detector of claim 17, wherein deposition of said Schottky metal layer comprises applying Au thin film with thickness between 5 nm and 40 nm by either sputtering or ebeam evaporation technique.

19. The method of making a UV detector of claim 17, wherein depositing a thin metal layer as a transparent Schottky metal comprises chemical vapor deposition.

20. The method of making a UV detector of claim 17, comprising growing the active layer at a rate of 0.3 Å per second or lower.

* * * * *